US011928329B2

(12) United States Patent
Jain et al.

(10) Patent No.: US 11,928,329 B2
(45) Date of Patent: Mar. 12, 2024

(54) SYSTEM AND METHOD FOR MANAGING ACCESS TO REGISTERS

(71) Applicant: NXP B.V., Eindhoven (NL)

(72) Inventors: Anshul Jain, Ghaziabad (IN); Nitin Kumar Jaiswal, Noida (IN); Sachin Prakash, Noida (IN)

(73) Assignee: NXP B.V., Eindhoven (NL)

( * ) Notice: Subject to any disclaimer, the term of this patent is extended or adjusted under 35 U.S.C. 154(b) by 210 days.

(21) Appl. No.: 17/457,373

(22) Filed: Dec. 2, 2021

(65) Prior Publication Data

US 2023/0176730 A1 Jun. 8, 2023

(51) Int. Cl.
G11C 11/419 (2006.01)
G06F 3/06 (2006.01)
G11C 19/28 (2006.01)

(52) U.S. Cl.
CPC .......... *G06F 3/0604* (2013.01); *G06F 3/0655* (2013.01); *G06F 3/0673* (2013.01); *G11C 19/285* (2013.01)

(58) Field of Classification Search
CPC ............. G06F 9/30018; G06F 9/30032; G06F 3/0655; G06F 3/0604; G06F 9/30098; G06F 3/0673; G11C 7/1006; G11C 19/285; G11C 19/00
See application file for complete search history.

(56) References Cited

U.S. PATENT DOCUMENTS

| 5,185,859 A | | 2/1993 | Guttag et al. | |
| 5,287,503 A | * | 2/1994 | Narad | G06F 9/30018 712/E9.019 |
| 5,321,823 A | * | 6/1994 | Grundmann | G06F 9/462 712/226 |
| 5,539,696 A | * | 7/1996 | Patel | G11C 7/1018 365/189.16 |
| 5,996,032 A | * | 11/1999 | Baker | G06F 13/387 358/1.11 |
| 7,174,405 B1 | | 2/2007 | Dumov et al. | |
| 7,404,068 B2 | | 7/2008 | Dybsetter et al. | |
| 2011/0231587 A1 | * | 9/2011 | Andersson | G06F 13/385 711/155 |

* cited by examiner

*Primary Examiner* — Tuan T Nguyen

(57) ABSTRACT

A register management system is coupled to a register. The register management system receives an address and functional data for a write operation to be performed on the register. The functional data includes write bits and mask bits associated with the write bits. One or more mask bits having a first logic state indicate that associated one or more write bits are to be written to the register, respectively. Based on the address, the register management system selects a first half of the register or a second half of the register to perform the write operation. Further, the register management system writes the one or more write bits associated with the one or more mask bits having the first logic state to one or more storage elements of the first half of the register or the second half of the register, respectively.

20 Claims, 6 Drawing Sheets

US 11,928,329 B2

SYSTEM AND METHOD FOR MANAGING ACCESS TO REGISTERS

FIELD OF USE

The present disclosure relates generally to electronic circuits, and, more particularly, to a system and a method for managing access to registers.

BACKGROUND

An integrated circuit includes various registers and a processor that initiates various access operations (e.g., write operations) with the registers. Typically, the processor may access a register in entirety even if a portion of the register is to be written to. Such a register access limits the performance of the processor.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
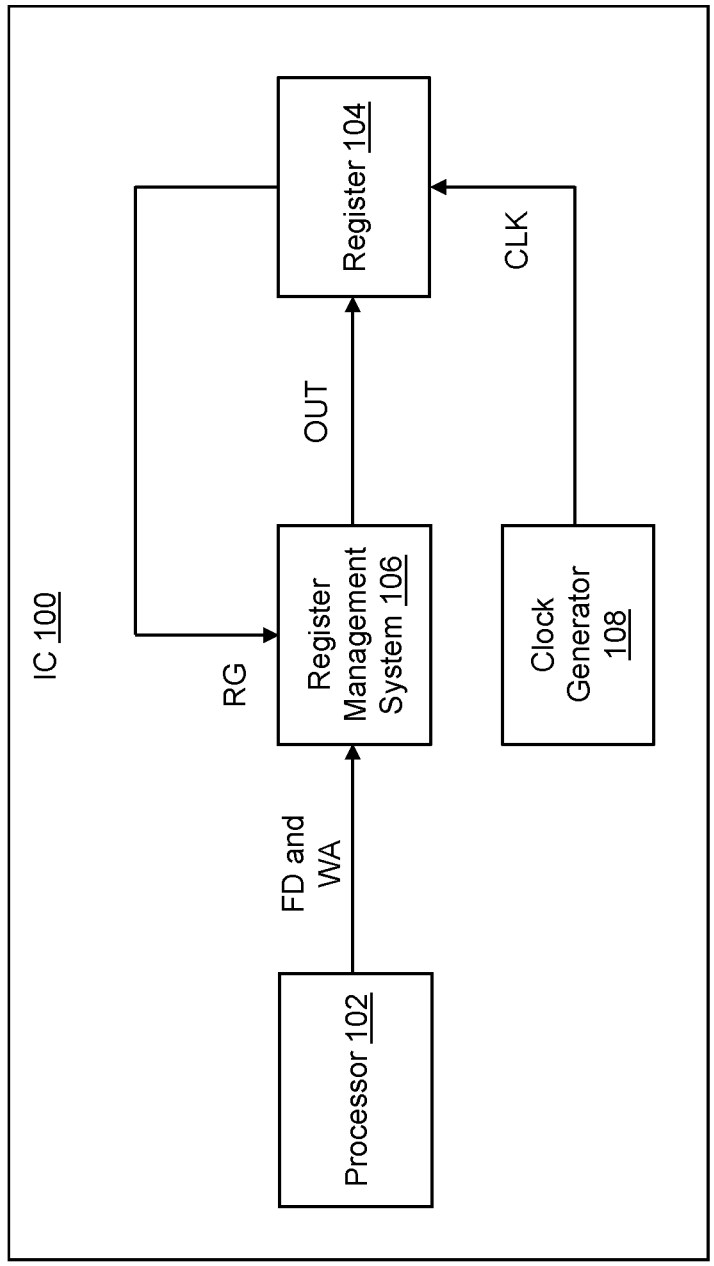
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include a register and a register management system that may be coupled to the register. The register may include a plurality of storage elements. The register management system may be configured to receive a write address and functional data for a write operation to be performed on the register. The functional data may include a set of write bits and a set of mask bits associated with the set of write bits, respectively. The set of mask bits may include one or more mask bits having a first logic state. The one or more mask bits having the first logic state indicate that associated one or more write bits of the set of write bits are to be written to the register, respectively. The register management system may be further configured to select, based on the write address, a set of storage elements from the plurality of storage elements to perform the write operation. The set of storage elements may correspond to one of a group consisting of a first half of the register and a second half of the register. The register management system may be further configured to write the one or more write bits associated with the one or more mask bits having the first logic state to one or more storage elements of the set of storage elements, respectively.

In another embodiment of the present disclosure, a register management method is disclosed. The register management method may include receiving a write address and functional data by a register management system for a write operation to be performed on a register. The functional data may include a set of write bits and a set of mask bits associated with the set of write bits, respectively. The set of mask bits may include one or more mask bits having a first logic state. The one or more mask bits having the first logic state indicate that associated one or more write bits of the set of write bits are to be written to the register, respectively. The register management method may further include selecting a set of storage elements of the register by the register management system to perform the write operation. The set of storage elements is selected based on the write address. The set of storage elements may correspond to one of a group consisting of a first half of the register and a second half of the register. The register management method may further include writing, by the register management system, the one or more write bits associated with the one or more mask bits having the first logic state to one or more storage elements of the set of storage elements, respectively.

In some embodiments, the register management system may be further configured to receive a set of register bits stored in the selected set of storage elements, respectively. The set of mask bits may further include one or more mask bits having a second logic state. The one or more mask bits having the second logic state indicate that associated one or more register bits of the set of register bits are to be written back to the register, respectively. The second logic state is different than the first logic state. The register management system may be further configured to write the one or more register bits to remaining storage elements of the selected set of storage elements.

In some embodiments, the plurality of storage elements may be configured to store a plurality of register bits, respectively. The plurality of register bits may include the set of register bits. The first half of the register stores a least significant bit of the plurality of register bits and the second half of the register stores a most significant bit of the plurality of register bits.

In some embodiments, the register management system may include an address decoder and a controller that may be coupled to the address decoder and the register. The address decoder may be configured to receive the write address and select, based on the write address, the set of storage elements from the plurality of storage elements to perform the write operation. Further, the address decoder may be configured to generate control data indicative of the selected set of storage elements. The controller may be configured to receive the functional data, the control data, and the set of register bits. Based on the control data, the controller may be further configured to write the one or more write bits associated with the one or more mask bits having the first logic state to the one or more storage elements of the selected set of storage elements, respectively. Similarly, the controller may be further configured to write, to the remaining storage elements of the selected set of storage elements based on the control data, the one or more register bits associated with the one or more mask bits having the second logic state, respectively.

In some embodiments, the control data may include a first control bit, a second control bit, and a third control bit.

In some embodiments, the second control bit having the first logic state and the first control bit and the third control bit having the second logic state indicate that the selected set of storage elements corresponds to the first half of the register.

In some embodiments, the third control bit having the first logic state and the first control bit and the second control bit having the second logic state indicate that the selected set of storage elements corresponds to the second half of the register.

In some embodiments, the address decoder may generate the first control bit, the second control bit, and the third control bit based on comparison of the write address with a first reference address, a second reference address, and a third reference address, respectively. The first reference address may correspond to an address for writing to the register in entirety. The second reference address may correspond to an address for writing to the first half of the register. Similarly, the third reference address may correspond to an address for writing to the second half of the register.

In some embodiments, the first control bit has the first logic state and the second control bit and the third control bit have the second logic state when the write address matches the first reference address. Further, the second control bit has the first logic state and the first control bit and the third control bit have the second logic state when the write address matches the second reference address. Similarly, the third control bit has the first logic state and the first control bit and the second control bit have the second logic state when the write address matches the third reference address.

In some embodiments, the controller may include a first set of logic circuits that may be coupled to the first half of the register and the address decoder. The first set of logic circuits may be configured to receive the functional data, the first control bit, the second control bit, and the set of register bits. The second control bit has the first logic state and the first control bit has the second logic state to indicate that the selected set of storage elements corresponds to the first half of the register. The first set of logic circuits may be further configured to write, based on the first and second control bits, the one or more write bits and the one or more register bits to the first half of the register.

In some embodiments, a logic circuit of the first set of logic circuits may include a first multiplexer that may be coupled to a first storage element of the first half of the register. The first multiplexer may be configured to receive a first write bit of the set of write bits, a first register bit of the set of register bits that is stored in the first storage element, and a first select bit that is derived from a first mask bit of the set of mask bits. Based on the first select bit, the first multiplexer may be further configured to select and output one of a group consisting of the first write bit and the first register bit as a first output bit. The first multiplexer may be further configured to write the first output bit to the first storage element. When the first mask bit has the first logic state, the first write bit is written to the first storage element, and when the first mask bit has the second logic state, the first register bit is written to the first storage element.

In some embodiments, the logic circuit of the first set of logic circuits may further include a first logic gate and a second logic gate. The first logic gate may be coupled to the address decoder. The first logic gate may be configured to receive the second control bit and the first mask bit and output a second select bit based on the second control bit and the first mask bit. The second select bit has the first logic state when the first mask bit and the second control bit have the first logic state. Further, the second select bit has the second logic state when at least one of a group consisting of the first mask bit and the second control bit has the second logic state. The second logic gate may be coupled to the address decoder, the first logic gate, and the first multiplexer. The second logic gate may be configured to receive the first control bit and the second select bit and output the first select bit based on the first control bit and the second select bit. The second logic gate may be further configured to provide the first select bit to the first multiplexer. The first select bit has the second logic state when the first control bit and the second select bit have the second logic state. Further, the first select bit has the first logic state when at least one of a group consisting of the first control bit and the second select bit has the first logic state.

In some embodiments, the controller may include a second set of logic circuits that may be coupled to the second half of the register and the address decoder. The second set of logic circuits may be configured to receive the functional data, the first control bit, the third control bit, and the set of register bits. The third control bit has the first logic state and the first control bit has the second logic state to indicate that the selected set of storage elements corresponds to the second half of the register. Based on the first and third control bits, the second set of logic circuits may be further configured to write the one or more write bits and the one or more register bits to the second half of the register.

In some embodiments, a logic circuit of the second set of logic circuits may include a second multiplexer and a third multiplexer. The second multiplexer may be coupled to the address decoder. The second multiplexer may be configured to receive a second write bit of the set of write bits, a second mask bit of the set of mask bits, and the third control bit. Based on the third control bit, the second multiplexer may be further configured to select and output one of a group consisting of the second write bit and the second mask bit as an intermediate bit. The third multiplexer may be coupled to the second multiplexer and a second storage element of the second half of the register. The third multiplexer may be configured to receive the intermediate bit, a second register bit of the set of register bits that is stored in the second storage element, and a third select bit that is derived from the second mask bit. Based on the third select bit, the third multiplexer may be further configured to select and output one of a group consisting of the second register bit and the intermediate bit as a second output bit. The third multiplexer may be further configured to write the second output bit to the second storage element. When the second mask bit has the first logic state, the second write bit is written to the second storage element. Further, when the second mask bit has the second logic state, the second register bit is written to the second storage element.

In some embodiments, the logic circuit of the second set of logic circuits may further include a third logic gate and a fourth logic gate. The third logic gate may be coupled to the address decoder. The third logic gate may be configured to receive the third control bit and the second mask bit and output a fourth select bit based on the third control bit and the second mask bit. The fourth select bit has the first logic state when the second mask bit and the third control bit have the first logic state. Further, the fourth select bit has the second logic state when at least one of a group consisting of the second mask bit and the third control bit has the second logic state. The fourth logic gate may be coupled to the address decoder, the third logic gate, and the third multiplexer. The fourth logic gate may be configured to receive the first control bit and the fourth select bit and output the third select bit based on the first control bit and the fourth select bit. The fourth logic gate may be further configured to provide the third select bit to the third multiplexer. The third select bit has the second logic state when the first control bit and the fourth select bit have the second logic state. Further, the third select bit has the first logic state when at least one of a group consisting of the first control bit and the fourth select bit has the first logic state.

In some embodiments, the IC may further include a processor that may be configured to initiate the write operation with the register, and output the write address and the functional data.

In some embodiments, the one or more write bits may include at least one of a group consisting of a write bit having a logic low state and a write bit having a logic high state.

Conventionally, when a processor is required to write to a portion of a register, the processor reads the entire data stored in the register, modifies one or more bits of the data, and writes the modified data back to the register. This is referred to as a read-modify-write operation. Such a read-modify-write operation results in the processor taking up a significant amount of clock cycles, thereby degrading the availability of the processor.

Various embodiments of the present disclosure disclose an integrated circuit (IC) that may include a processor, a register, and a register management system. The processor may initiate a write operation to be performed on the register. The register management system may receive a write address and functional data for the write operation from the processor. The functional data may include various write bits and various mask bits associated with the write bits. Each mask bit indicates whether an associated write bit is to be written to the register. For example, mask bits of the functional data that are in an activated state indicate that associated write bits of the functional data are to be written to the register. Based on the write address, the register management system may select a first half of the register or a second half of the register to perform the write operation. Further, the register management system may write, to one or more storage elements of the first half or the second half of the register, the write bits associated with the activated mask bits. The write bits written to the register may include bits having a logic low state, bits having a logic high state, or a combination thereof.

The register management system of the present disclosure thus enables bit-wise write operations with the register. As the bit-wise write operations are enabled, a need to perform read-modify-write operations is eliminated. As a result, a number of clock cycles required by the processor of the present disclosure to perform the write operation significantly reduces, thereby increasing the availability of the processor.

FIG. 1 illustrates a schematic block diagram of an integrated circuit (IC) 100 in accordance with an embodiment of the present disclosure. The IC 100 may include a processor 102 and a plurality of registers of which a register 104 is shown. The IC 100 may further include a register management system 106 that may be coupled between the processor 102 and the register 104.

The following table illustrates various signals and data described in FIG. 1:

| Signal/Data | Description |
| --- | --- |
| Write address WA | Address for performing a write operation on the entire register 104, a first half of the register 104, or a second half of the register 104 |
| Functional data FD | Binary data for the write operation |
| Register data RG | Binary data stored in the register 104 |
| Output data OUT | Binary data written to the register 104 when the write operation is performed on the register 104 |
| Clock signal CLK | Synchronizes various storage elements of the register 104 |

The register 104 may be configured to store register data RG. The register 104 may be divided into a first half of the register 104 and a second half of the register 104. The first half of the register 104 may store a least significant bit (LSB) of the register data RG and the second half of the register 104 may store a most significant bit (MSB) of the register data RG. In other words, the first half of the register 104 may correspond to a lower half of the register 104 and the second half of the register 104 may correspond to an upper half of the register 104. The register 104 may include various storage elements (e.g., flip-flops) configured to store various register bits of the register data RG. The register 104 may be included in a functional circuit (not shown). In such a scenario, the functional circuit may be configured to perform various operations associated therewith based on the register data RG. Remaining registers of the plurality of registers are structurally and functionally similar to the register 104. The register 104 is explained in detail in conjunction with FIG. 2.

The processor 102 may include suitable circuitry that may be configured to perform one or more operations. For example, the processor 102 may be configured to initiate a write operation with the register 104. The write operation may be for the entire register 104, the first half of the register 104, or the second half of the register 104. Further, the processor 102 may be configured to output a write address WA and functional data FD for the write operation. The processor 102 may be further configured to provide the write address WA and the functional data FD to the register management system 106.

Write Address WA:

When the write address WA corresponds to a first reference address (shown later in FIG. 2), the write operation is for the entire register 104. Similarly, when the write address WA corresponds to a second reference address and a third reference address (shown later in FIG. 2), the write operation is for the first and second halves of the register 104, respectively.

Functional Data FD:

A number of bits of the functional data FD is equal to a number of storage elements of the register 104. In an example, the register 104 is a four-bit register. In such a scenario, a number of bits of the functional data FD is four. When the write operation is for the entire register 104, the entire functional data FD is to be written to the register 104. When the write operation is for the first half of the register 104 or the second half of the register 104, the functional data FD is divided into a set of write bits and a set of mask bits that is associated with the set of write bits, respectively. A number of write bits of the set of write bits is equal to a number of mask bits of the set of mask bits. The set of mask bits may be further associated with one of the first and second halves of the register 104 (e.g., register bits stored in one of the first and second halves of the register 104).

The set of write bits may include write bits having a logic low state, write bits having a logic high state, or a combination thereof. Further, the set of mask bits may include one or more mask bits having a first logic state and one or more mask bits having a second logic state. Each mask bit of the set of mask bits indicates whether an associated write bit of the set of write bits is to be written to the register 104. For example, the one or more mask bits having the first logic state indicate that associated one or more write bits of the set of write bits are to be written to the register 104, respectively. Further, the one or more mask bits having the second logic state indicate that associated one or more write bits of the set of write bits are not to be written to the register 104, respectively. Such bits of the register 104 thus remain unchanged. In an embodiment, the first logic state corresponds to an activated state (e.g., a logic high state) and the second logic state corresponds to a deactivated state (e.g., a logic low state). In other words, one or more mask bits of the set of mask bits are activated to indicate that the associated write bits are to be written to the register 104, and remaining mask bits of the set of mask bits are deactivated to indicate that the associated write bits are not to be written to the register 104.

The write operation initiated by the processor 102 may be a posted write operation or a non-posted write operation. When the write operation initiated by the processor 102 is a posted write operation, the processor 102 is available to perform various operations associated therewith after providing the write address WA and the functional data FD to the register management system 106. When the write operation initiated by the processor 102 is a non-posted write operation, the processor 102 may be further configured to receive an acknowledgment signal (not shown) from the register management system 106 in response to the write address WA and the functional data FD. In other words, the operations of the processor 102 are halted until the acknowledgment signal is received. Examples of the processor 102 may include a math accelerator, a digital signal processor, an image processor, or the like.

The register management system 106 may be configured to receive the write address WA and the functional data FD from the processor 102 and the register data RG from the register 104. Based on the write address WA, the register management system 106 may be further configured to select a portion of the register 104 (e.g., various storage elements of the register 104) to perform the write operation. The selected portion may correspond to the first half of the register 104, the second half of the register 104, or the register 104 in entirety. The register management system 106 may be further configured to write output data OUT to the register 104.

When the write address WA indicates that the write operation for the first half of the register 104 or the second half of the register 104, the output data OUT may include the one or more write bits associated with the one or more mask bits having the first logic state, respectively. The one or more write bits are written in place of one or more register bits of the register data RG, respectively. The remaining register bits of the register data RG are written back to the register 104. The remaining register bits of the register data RG include one or more register bits associated with the one or more mask bits having the second logic state, respectively. Thus, each output bit of the output data OUT may correspond to a register bit of the register data RG or a write bit of the functional data FD. Alternatively, when the write address WA indicates that the write operation for the entire register 104, the functional data FD is outputted as the output data OUT and written to the register 104.

Although not shown, the IC 100 may include multiple register management systems operating in a similar manner as described above. Further, each additional register management system may be coupled to an associated register of the plurality of registers. The register management system 106 is explained in detail in conjunction with FIG. 2.

The IC 100 may further include a clock generator 108 that may be coupled to the register 104. The clock generator 108 may be configured to generate a clock signal CLK and provide the clock signal CLK to the register 104 to synchronize the register 104 (e.g., various storage elements of the register 104).

Figure 2:
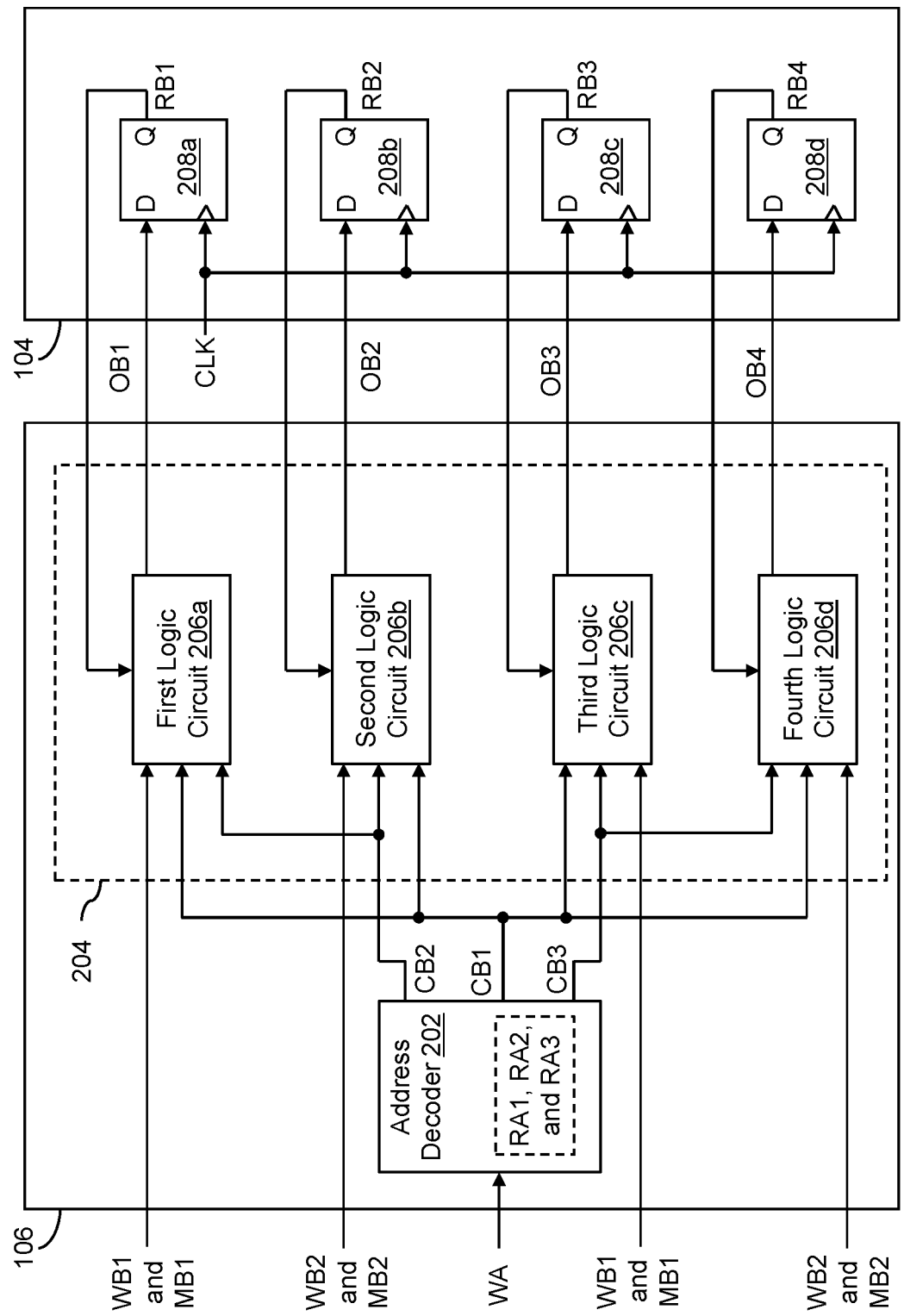
FIG. 2 illustrates schematic block diagrams of a register management system of the IC of FIG. 1 and a register of the IC of FIG. 1 in accordance with an embodiment of the present disclosure.

FIG. 2 illustrates schematic block diagrams of the register management system 106 and the register 104 in accordance with an embodiment of the present disclosure. The register management system 106 may include an address decoder 202 and a controller 204. The controller 204 may include a first logic circuit 206a, a second logic circuit 206b, a third logic circuit 206c, and a fourth logic circuit 206d. The register 104 may include a first storage element 208a, a second storage element 208b, a third storage element 208c, and a fourth storage element 208d.

The following table illustrates various data described in FIG. 2:

| Data | Description |
|---|---|
| First reference address RA1 | Address for writing to the register 104 in entirety |
| Second reference address RA2 | Address for writing to the first half of the register 104 |
| Third reference address RA3 | Address for writing to the second half of the register 104 |
| Control data CB1-CB3 | Indicates whether the write operation is for the entire register 104, the first half of the register 104, or the second half of the register 104 |
| First and second write bits WB1 and WB2 and first and second mask bits MB1 and MB2 | Constitute the functional data FD, and the first and second write bits WB1 and WB2 may be written to the register 104 based on the write address WA and the first and second mask bits MB1 and MB2, respectively |

-continued

| Data | Description |
|---|---|
| First through fourth register bits RB1-RB4 | Constitute the register data RG, and one or more register bits of the first through fourth register bits RB1-RB4 may be written back to the register 104 based on the write address WA and the first and second mask bits MB1 and MB2 |
| First through fourth output bits OB1-OB4 | Constitute the output data OUT, and are written to the first through fourth storage elements 208a-208d, respectively |

The register 104 is shown to include four storage elements to make the illustrations concise and clear and should not be considered as a limitation of the present disclosure. The first through fourth storage elements 208a-208d may be coupled to the first through fourth logic circuits 206a-206d, respectively. The first and second storage elements 208a and 208b may be configured to store a first register bit RB1 of the register data RG and a second register bit RB2 of the register data RG, respectively. Further, the third and fourth storage elements 208c and 208d may be configured to store a third register bit RB3 of the register data RG and a fourth register bit RB4 of the register data RG, respectively. In an embodiment, the first register bit RB1 is the LSB of the register data RG and the fourth register bit RB4 is the MSB of the register data RG. Thus, the first and second storage elements 208a and 208b may correspond to the first half of the register 104, and the third and fourth storage elements 208c and 208d may correspond to the second half of the register 104.

The first through fourth storage elements 208a-208d are collectively referred to as a "plurality of storage elements 208" and the first through fourth register bits RB1-RB4 are collectively referred to as a "plurality of register bits RB1-RB4". Each storage element of the plurality of storage elements 208 may be coupled to the clock generator 108. Each storage element of the plurality of storage elements 208 may be configured to receive the clock signal CLK from the clock generator 108. Thus, each storage element of the plurality of storage elements 208 may be synchronized based on the clock signal CLK. In an embodiment, each storage element of the plurality of storage elements 208 corresponds to a D flip-flop. However, various other circuits may be implemented as storage elements in other embodiments.

The address decoder 202 may be coupled to the processor 102 and the controller 204 (e.g., the first through fourth logic circuits 206a-206d). The address decoder 202 may include suitable circuitry that may be configured to perform one or more operations. For example, the address decoder 202 may be configured to receive, from the processor 102, the write address WA for the write operation to be performed on the register 104. Based on the write address WA, the address decoder 202 may be further configured to select whether the write operation is to be performed on the entire register 104, the first half of the register 104, or the second half of the register 104. In other words, the address decoder 202 may be further configured to select, based on the write address WA, a set of storage elements from the plurality of storage elements 208 to perform the write operation. The selected set of storage elements may correspond to the first and second storage elements 208a and 208b (e.g., the first half of the register 104), the third and fourth storage elements 208c and 208d (e.g., the second half of the register 104), or the first through fourth storage elements 208a-208d (e.g., the entire register 104). Further, the address decoder 202 may be configured to generate control data indicative of the selected set of storage elements.

Control Data CB1-CB3:

The control data may include a first control bit CB1, a second control bit CB2, and a third control bit CB3. Thus, the control data is hereinafter referred to as the "control data CB1-CB3". The address decoder 202 may generate the first control bit CB1 based on comparison of the write address WA with the first reference address (hereinafter referred to and designated as the "first reference address RA1"). Similarly, the address decoder 202 may generate the second control bit CB2 and the third control bit CB3 based on comparison of the write address WA with the second and third reference address (hereinafter referred to and designated as the "second reference address RA2" and the "third reference address RA3"), respectively. The first through third reference addresses RA1-RA3 may be stored in a buffer memory (not shown) of the address decoder 202. The first reference address RA1 may correspond to an address for writing to the register 104 in entirety. Further, the second reference address RA2 may correspond to an address for writing to the first half of the register 104, and the third reference address RA3 may correspond to an address for writing to the second half of the register 104.

The address decoder 202 generates the first control bit CB1 having the first logic state (e.g., having a logic high state) when the write address WA matches the first reference address RA1. Further, the address decoder 202 generates the second control bit CB2 having the first logic state (e.g., having a logic high state) when the write address WA matches the second reference address RA2. Similarly, the address decoder 202 generates the third control bit CB3 having the first logic state (e.g., having a logic high state) when the write address WA matches the third reference address RA3. Thus, when the write operation is for the entire register 104 (e.g., when the write address WA matches the first reference address RA1), the first control bit CB1 has the first logic state and the second and third control bits CB2 and CB3 have the second logic state (e.g., have a logic low state). Further, when the write operation is for the first half of the register 104 (e.g., when the write address WA matches the second reference address RA2), the first and third control bits CB1 and CB3 have the second logic state (e.g., have a logic low state) and the second control bit CB2 has the first logic state. Similarly, when the write operation is for the second half of the register 104 (e.g., when the write address WA matches the third reference address RA3), the first and second control bits CB1 and CB2 have the second logic state (e.g., have a logic low state) and the third control bit CB3 has the first logic state.

The address decoder 202 may be further configured to provide the first through third control bits CB1-CB3 (e.g., the control data CB1-CB3) to the controller 204. For example, the address decoder 202 may be further configured to provide the first and second control bits CB1 and CB2 to the first and second logic circuits 206a and 206b, and the first and third control bits CB1 and CB3 to the third and fourth logic circuits 206c and 206d.

The controller 204 may be coupled to the address decoder 202, the processor 102, and the register 104. The controller 204 may be configured to receive the functional data FD for the write operation from the processor 102. The functional data FD may include the set of write bits and the set of mask bits. In an example, the set of write bits includes a first write bit WB1 and a second write bit WB2, and the set of mask bits includes a first mask bit MB1 and a second mask bit MB2. The first and second mask bits MB1 and MB2 are associated with the first and second write bits WB1 and WB2, respectively. The controller 204 may be further configured to receive the control data CB1-CB3 (e.g., the first through third control bits CB1-CB3) from the address decoder 202. Further, the controller 204 may be configured to receive the register data RG (e.g., the first through fourth register bits RB1-RB4) from the register 104. Based on the control data CB1-CB3, the register data RG, and the functional data FD, the controller 204 may be further configured to write the output data OUT to the register 104. The output data OUT may be written to the register 104 in synchronization with the clock signal CLK.

Writing to the Entire Register 104:

When the write address WA matches the first reference address RA1, the controller 204 outputs the functional data FD as the output data OUT. Further, the controller 204 writes the output data OUT to the plurality of storage elements 208 of the register 104. For example, the first and second write bits WB1 and WB2 are written to the first and second storage elements 208a and 208b, respectively. Further, the first and second mask bits MB1 and MB2 are written to the third and fourth storage elements 208c and 208d, respectively.

Writing to the First Half of the Register 104:

When the write address WA matches the second reference address RA2, the write operation is for the first half of the register 104. In such a scenario, the first and second mask bits MB1 and MB2 are further associated with the first and second storage elements 208a and 208b, respectively. The first and second mask bits MB1 and MB2 thus indicate whether the first and second write bits WB1 and WB2 are to be written to the first and second storage elements 208a and 208b, respectively. In an example, the first mask bit MB1 has the first logic state (e.g., has a logic high state) to indicate that the first write bit WB1 is to be written to the register 104. Further, the second mask bit MB2 has the second logic state (e.g., has a logic low state) to indicate that the second write bit WB2 is not to be written to the register 104. In other words, the second mask bit MB2 indicates that the second register bit RB2 is to be written back to the register 104.

The controller 204 thus outputs the first write bit WB1 as a first output bit OB1 of the output data OUT. The first write bit WB1 may have a logic low state or a logic high state. The controller 204 outputs the first write bit WB1 based on the first mask bit MB1 and the control data CB1-CB3. Further, the controller 204 is configured to write the first write bit WB1 to the first storage element 208a. When the first write bit WB1 has a logic high state, the writing of the first write bit WB1 to the first storage element 208a is referred to as performing a set operation on the first storage element 208a. Conversely, when the first write bit WB1 has a logic low state, the writing of the first write bit WB1 to the first storage element 208a is referred to as performing a clear operation on the first storage element 208a.

For the second storage element 208b, as the second mask bit MB2 has the second logic state, the controller 204 may be further configured to output the second register bit RB2 as a second output bit OB2 of the output data OUT. Further, the controller 204 may be configured to write the second output bit OB2 to the second storage element 208b. Thus, the second storage element 208b remains unchanged. In other words, the second storage element 208b is refreshed.

For the third and fourth storage elements 208c and 208d, the controller 204 may be further configured to output the third and fourth register bits RB3 and RB4 as third and fourth output bits OB3 and OB4 of the output data OUT, respectively. The controller 204 may be further configured to write the third and fourth output bits OB3 and OB4 to the third and fourth storage elements 208c and 208d, respectively. The controller 204 thus writes the output data OUT to the register 104.

Writing to the Second Half of the Register 104:

When the write address WA matches the third reference address RA3, the write operation is for the second half of the register 104. In such a scenario, the first and second mask bits MB1 and MB2 are further associated with the third and fourth storage elements 208c and 208d, respectively. The first and second mask bits MB1 and MB2 thus indicate whether the first and second write bits WB1 and WB2 are to be written to the third and fourth storage elements 208c and 208d, respectively. In an example, the first and second mask bits MB1 and MB2 have the first logic state and the second logic state, respectively. The controller 204 thus outputs the first write bit WB1 as the third output bit OB3 and the fourth register bit RB4 as the fourth output bit OB4. The controller 204 outputs the first write bit WB1 based on the first mask bit MB1 and the control data CB1-CB3, and the fourth register bit RB4 based on the control data CB1-CB3 and the second mask bit MB2. For the first and second storage elements 208a and 208b, the controller 204 may be further configured to output the first and second register bits RB1 and RB2 as the first and second output bits OB1 and OB2, respectively. The controller 204 may be further configured to write the first through fourth output bits OB1-OB4 to the first through fourth storage elements 208a-208d, respectively. The controller 204 thus writes the output data OUT to the register 104.

The first logic circuit 206a may be coupled to the first storage element 208a, the processor 102, and the address decoder 202. The first logic circuit 206a may be configured to receive the first write bit WB1 and the first mask bit MB1 from the processor 102. Further, the first logic circuit 206a may be configured to receive the first and second control bits CB1 and CB2 from the address decoder 202 and the first register bit RB1 from the first storage element 208a. Based on the first and second control bits CB1 and CB2 and the first mask bit MB1, the first logic circuit 206a may be further configured to output the first write bit WB1 or the first register bit RB1 as the first output bit OB1. Further, the first logic circuit 206a may be configured to write the first output bit OB1 to the first storage element 208a (e.g., by way of an input terminal of the corresponding D flip-flop and in synchronization with the clock signal CLK received at a clock terminal of the corresponding D flip-flop).

When the write operation is for the entire register 104, the first control bit CB1 has the first logic state (e.g., has a logic high state) and the second control bit CB2 has the second logic state (e.g., has a logic low state). In such a scenario, the first logic circuit 206a outputs the first write bit WB1 as the first output bit OB1. When the write operation is for the first half of the register 104, the first control bit CB1 has the second logic state (e.g., has a logic low state) and the second control bit CB2 has the first logic state (e.g., has a logic high state). In such a scenario, if the first mask bit MB1 has the first logic state (e.g., has a logic high state), the first logic circuit 206a outputs the first write bit WB1 as the first output bit OB1. Conversely, if the first mask bit MB1 has the second logic state (e.g., has a logic low state), the first logic circuit 206a outputs the first register bit RB1 as the first output bit OB1. When the write operation is for the second half of the register 104, the first and second control bits CB1 and CB2 have the second logic state (e.g., have a logic low state). In such a scenario, the first logic circuit 206a outputs the first register bit RB1 as the first output bit OB1. The first logic circuit 206a is explained in detail in conjunction with FIG. 7.

The second logic circuit 206b may be coupled to the second storage element 208b, the processor 102, and the address decoder 202. The second logic circuit 206b may be configured to receive the second write bit WB2 and the second mask bit MB2 from the processor 102. Further, the second logic circuit 206b may be configured to receive the first and second control bits CB1 and CB2 from the address decoder 202 and the second register bit RB2 from the second storage element 208b. Based on the first and second control bits CB1 and CB2 and the second mask bit MB2, the second logic circuit 206b may be further configured to output the second write bit WB2 or the second register bit RB2 as the second output bit OB2. Further, the second logic circuit 206b may be configured to write the second output bit OB2 to the second storage element 208b (e.g., by way of an input terminal of the corresponding D flip-flop and in synchronization with the clock signal CLK received at a clock terminal of the corresponding D flip-flop).

When the write operation is for the entire register 104, the second logic circuit 206b outputs the second write bit WB2 as the second output bit OB2. When the write operation is for the first half of the register 104, if the second mask bit MB2 has the first logic state (e.g., has a logic high state), the second logic circuit 206b outputs the second write bit WB2 as the second output bit OB2. Conversely, if the second mask bit MB2 has the second logic state (e.g., has a logic low state), the second logic circuit 206b outputs the second register bit RB2 as the second output bit OB2. When the write operation is for the second half of the register 104, the second logic circuit 206b outputs the second register bit RB2 as the second output bit OB2.

The first and second logic circuits 206a and 206b are collectively referred to as a "first set of logic circuits 206a and 206b". The first set of logic circuits 206a and 206b is thus associated with the first half of the register 104. When the write operation is for the entire register 104, the first set of logic circuits 206a and 206b writes the set of write bits (e.g., the first and second write bits WB1 and WB2) to the first half of the register 104. When the write operation is for the first half of the register 104, the first set of logic circuits 206a and 206b writes the first write bit WB1 (e.g., a write bit associated with a mask bit having the first logic state) and the second register bit RB2 (e.g., a register bit associated with a mask bit having the second logic state) to the first half of the register 104. When the write operation is for the second half of the register 104, the first set of logic circuits 206a and 206b writes the first and second register bits RB1 and RB2 to the first half of the register 104.

The third logic circuit 206c may be coupled to the third storage element 208c, the processor 102, and the address decoder 202. The third logic circuit 206c may be configured to receive the first write bit WB1 and the first mask bit MB1 from the processor 102. Further, the third logic circuit 206c may be configured to receive the first and third control bits CB1 and CB3 from the address decoder 202 and the third register bit RB3 from the third storage element 208c. Based on the first and third control bits CB1 and CB3 and the first mask bit MB1, the third logic circuit 206c may be further configured to output the first write bit WB1, the first mask bit MB1, or the third register bit RB3 as the third output bit OB3. Further, the third logic circuit 206c may be configured to write the third output bit OB3 to the third storage element 208c (e.g., by way of an input terminal of the corresponding D flip-flop and in synchronization with the clock signal CLK received at a clock terminal of the corresponding D flip-flop).

When the write operation is for the entire register 104, the first control bit CB1 has the first logic state (e.g., has a logic high state) and the third control bit CB3 has the second logic state (e.g., has a logic low state). The third logic circuit 206c thus outputs the first mask bit MB1 as the third output bit OB3. In such a scenario, the first mask bit MB1 corresponds to a third write bit. When the write operation is for the first half of the register 104, the first and third control bits CB1 and CB3 have the second logic state (e.g., have a logic low state). In such a scenario, the third logic circuit 206c outputs the third register bit RB3 as the third output bit OB3. When the write operation is for the second half of the register 104, the first control bit CB1 has the second logic state (e.g., has a logic low state) and the third control bit CB3 has the first logic state (e.g., has a logic high state). In such a scenario, if the first mask bit MB1 has the first logic state (e.g., has a logic high state), the third logic circuit 206c outputs the first write bit WB1 as the third output bit OB3. Conversely, if the first mask bit MB1 has the second logic state (e.g., has a logic low state), the third logic circuit 206c outputs the third register bit RB3 as the third output bit OB3.

The fourth logic circuit 206d may be coupled to the fourth storage element 208d, the processor 102, and the address decoder 202. The fourth logic circuit 206d may be configured to receive the second write bit WB2 and the second mask bit MB2 from the processor 102. Further, the fourth logic circuit 206d may be configured to receive the first and third control bits CB1 and CB3 from the address decoder 202 and the fourth register bit RB4 from the fourth storage element 208d. Based on the first and third control bits CB1 and CB3 and the second mask bit MB2, the fourth logic circuit 206d may be further configured to output the second write bit WB2, the second mask bit MB2, or the fourth register bit RB4 as the fourth output bit OB4. Further, the fourth logic circuit 206d may be configured to write the fourth output bit OB4 to the fourth storage element 208d (e.g., by way of an input terminal of the corresponding D flip-flop and in synchronization with the clock signal CLK received at a clock terminal of the corresponding D flip-flop). The fourth logic circuit 206d is explained in detail in conjunction with FIG. 8.

When the write operation is for the entire register 104, the fourth logic circuit 206d outputs the second mask bit MB2 as the fourth output bit OB4. In such a scenario, the second mask bit MB2 corresponds to a fourth write bit. When the write operation is for the first half of the register 104, the fourth logic circuit 206d outputs the fourth register bit RB4 as the fourth output bit OB4. When the write operation is for the second half of the register 104, if the second mask bit MB2 has the first logic state (e.g., has a logic high state), the fourth logic circuit 206d outputs the second write bit WB2 as the fourth output bit OB4. Conversely, if the second mask bit MB2 has the second logic state (e.g., has a logic low state), the fourth logic circuit 206d outputs the fourth register bit RB4 as the fourth output bit OB4.

The third and fourth logic circuits 206c and 206d are collectively referred to as a "second set of logic circuits 206c and 206d". The second set of logic circuits 206c and 206d is thus associated with the second half of the register 104. When the write operation is for the entire register 104, the second set of logic circuits 206c and 206d writes the set of mask bits (e.g., the first and second mask bits MB1 and MB2) to the second half of the register 104. When the write operation is for the first half of the register 104, the second set of logic circuits 206c and 206d writes the third and fourth register bits RB3 and RB4 to the second half of the register 104. When the write operation is for the second half of the register 104, the second set of logic circuits 206c and 206d writes the first write bit WB1 (e.g., a write bit associated with a mask bit having the first logic state) and the fourth register bit RB4 (e.g., a register bit associated with a mask bit having the second logic state) to the second half of the register 104.

The register 104 is shown to include four storage elements, the functional data FD is shown to include two write bits and two mask bits, and the controller 204 is shown to include four logic circuits to make the illustrations concise and clear, and should not be considered as a limitation of the present disclosure. In various other embodiments, the register 104 may include more than four storage elements, without deviating from the scope of the present disclosure. In such a scenario, a number of bits of the functional data FD and a number of logic circuits of the controller 204 may be equal to the number of storage elements of the register 104.

The scope of the present disclosure is not limited to the first logic state being a logic high state and the second logic state being a logic low state. In an alternate embodiment, the first and second logic states may correspond to a logic low state and a logic high state, respectively, without deviating from the scope of the present disclosure. In such a scenario, a write bit is written to the register when the associated mask bit has a logic low state.

Figure 3:
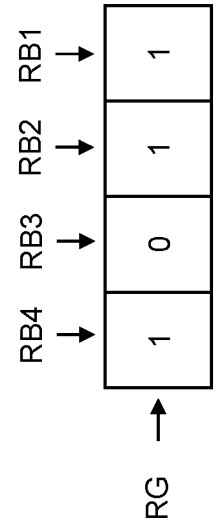
FIG. 3 is a schematic diagram that illustrates register data stored in the register of FIG. 2 before a write operation is performed thereon and functional data associated with the write operation in accordance with an embodiment of the present disclosure.
Figure 5:
FIG. 5 is a schematic diagram that illustrates the register data after the write operation is performed on the first half of the register of FIG. 2 in accordance with an embodiment of the present disclosure.
Figure 4:
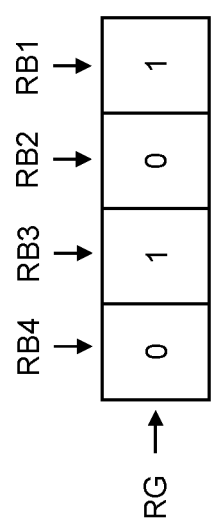
FIG. 4 is a schematic diagram that illustrates the register data after the write operation is performed on the entire register of FIG. 2 in accordance with an embodiment of the present disclosure.
Figure 6:
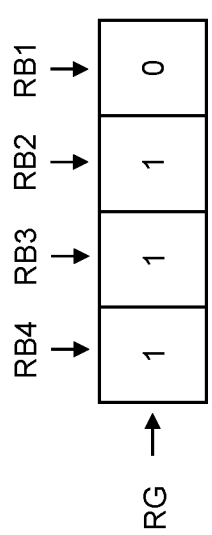
FIG. 6 is a schematic diagram that illustrates the register data after the write operation is performed on the second half of the register of FIG. 2 in accordance with an embodiment of the present disclosure.

FIG. 3 is a schematic diagram that illustrates the register data RG stored in the register 104 before the write operation is performed on the register 104 and the functional data FD associated with the write operation in accordance with an embodiment of the present disclosure. The register data RG is shown to include four register bits (e.g., the first through fourth register bits RB1-RB4). In the exemplary illustration, the first and third register bits RB1 and RB3 have a logic low state (illustrated as "0" in FIG. 3) and the second and fourth register bits RB2 and RB4 have a logic high state (illustrated as "1" in FIG. 3). Further, the functional data FD is shown to include two write bits (e.g., the first and second write bits WB1 and WB2) and two mask bits (e.g., the first and second mask bits MB1 and MB2). The first write bit WB1 has a logic high state (illustrated as "1" in FIG. 3) and the second write bit WB2 has a logic low state (illustrated as "0" in FIG. 3). Similarly, the first mask bit MB1 has a logic high state (illustrated as "1" in FIG. 3) and the second mask bit MB2 has a logic low state (illustrated as "0" in FIG. 3). The update of the register 104 when the write operation is performed on the register 104 is illustrated in FIGS. 4, 5, and 6. FIGS. 4, 5, and 6 illustrate the register data RG after the write operation is performed on the entire register 104, the first half of the register 104, and the second half of the register 104, respectively.

FIG. 4 is a schematic diagram that illustrates the register data RG after the write operation is performed on the entire register 104 in accordance with an embodiment of the present disclosure. It is assumed that the write address WA matches the first reference address RA1 (e.g., the write operation is to be performed on the entire register 104). In such a scenario, the first and second write bits WB1 and WB2 and the first and second mask bits MB1 and MB2 are written to the first through fourth storage elements 208a-208d, respectively. Thus, after the write operation, the first and third register bits RB1 and RB3 have a logic high state (illustrated as "1" in FIG. 4) and the second and fourth register bits RB2 and RB4 have a logic low state (illustrated as "0" in FIG. 4).

FIG. 5 is a schematic diagram that illustrates the register data RG after the write operation is performed on the first half of the register 104 in accordance with an embodiment of the present disclosure. It is assumed that the write address WA matches the second reference address RA2 (e.g., the write operation is to be performed on the first half of the register 104). In such a scenario, the third and fourth register bits RB3 and RB4 are written back to the register 104. In other words, the third and fourth storage elements 208c and 208d are refreshed. Further, as the first mask bit MB1 has a logic high state, the first write bit WB1 is written to the first storage element 208a. Similarly, as the second mask bit MB2 has a logic low state, the second register bit RB2 is written back to the register 104. In other words, the second storage element 208b is refreshed. Thus, after the write operation, the first, second, fourth register bits RB1, RB2, and RB4 have a logic high state (illustrated as "1" in FIG. 5) and the third register bit RB3 has a logic low state (illustrated as "0" in FIG. 5).

FIG. 6 is a schematic diagram that illustrates the register data RG after the write operation is performed on the second half of the register 104 in accordance with an embodiment of the present disclosure. It is assumed that the write address WA matches the third reference address RA3 (e.g., the write operation is to be performed on the second half of the register 104). In such a scenario, the first and second register bits RB1 and RB2 are written back to the register 104. In other words, the first and second storage elements 208a and 208b are refreshed. Further, as the first mask bit MB1 has a logic high state, the first write bit WB1 is written to the third storage element 208c. Similarly, as the second mask bit MB2 has a logic low state, the fourth register bit RB4 is written back to the register 104. In other words, the fourth storage element 208d is refreshed. Thus, after the write operation, the second through fourth register bits RB2-RB4 have a logic high state (illustrated as "1" in FIG. 6) and the first register bit RB1 has a logic low state (illustrated as "0" in FIG. 6).

Figure 7:
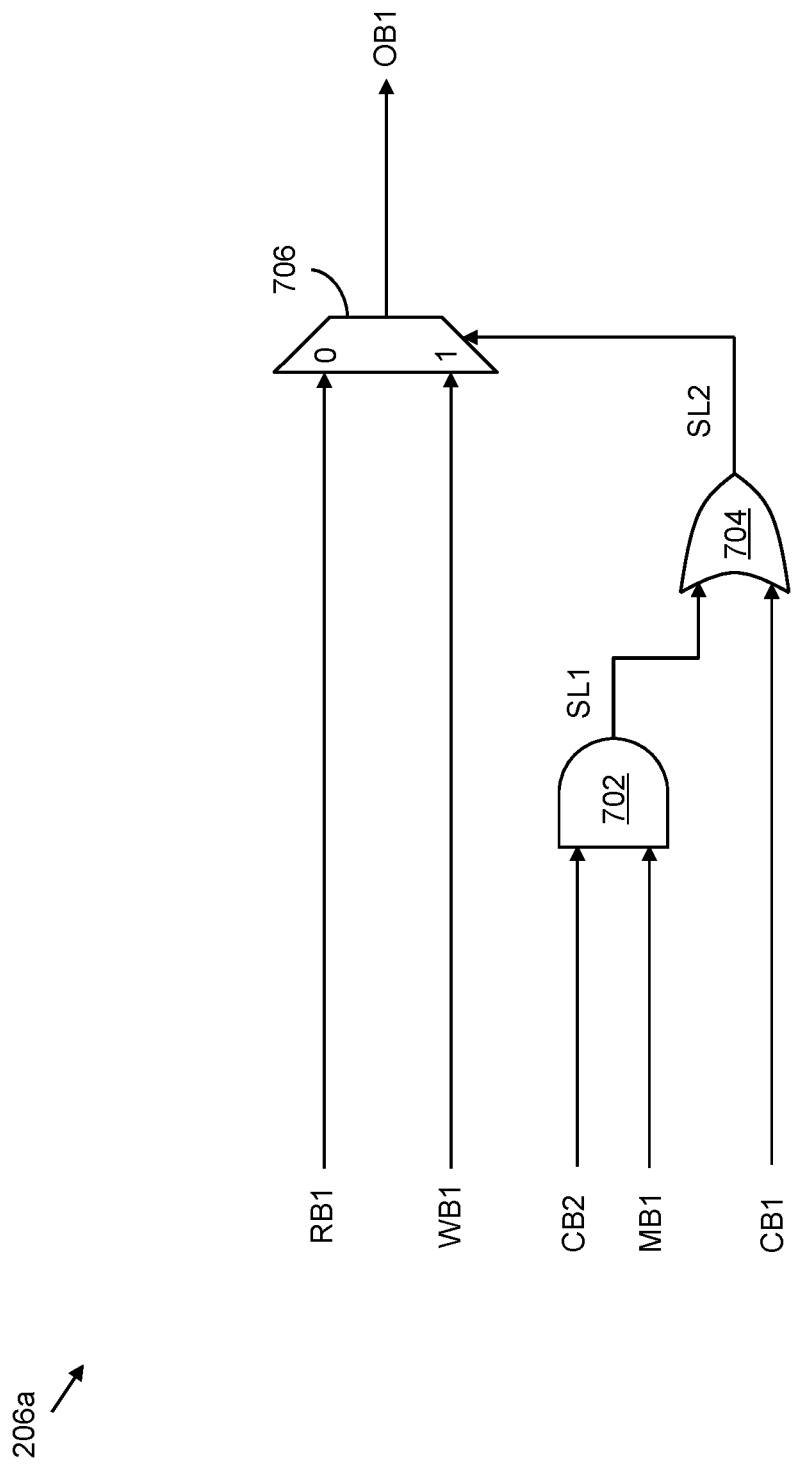
FIG. 7 illustrates a schematic circuit diagram of a logic circuit of a first set of logic circuits of the register management system of FIG. 2 in accordance with an embodiment of the present disclosure.

FIG. 7 illustrates a schematic circuit diagram of the first logic circuit 206a in accordance with an embodiment of the present disclosure. The first logic circuit 206a may include a first logic gate 702, a second logic gate 704, and a first multiplexer 706. The second logic circuit 206b is structurally similar to the first logic circuit 206a.

The first logic gate 702 may be coupled to the processor 102 and the address decoder 202. The first logic gate 702 may be configured to receive the first mask bit MB1 and the second control bit CB2 from the processor 102 and the address decoder 202, respectively. Based on the first mask bit MB1 and the second control bit CB2, the first logic gate 702 may be further configured to output a first select bit SL1. In an embodiment, the first logic gate 702 is an AND gate. Thus, the first logic gate 702 outputs the first select bit SL1 having the first logic state (e.g., having a logic high state) when the first mask bit MB1 and the second control bit CB2 have the first logic state. Further, the first logic gate 702 outputs the first select bit SL1 having the second logic state (e.g., having a logic low state) when at least one of the first mask bit MB1 and the second control bit CB2 has the second logic state.

The second logic gate 704 may be coupled to the address decoder 202 and the first logic gate 702. The second logic gate 704 may be configured to receive the first control bit CB1 and the first select bit SL1 from the address decoder 202 and the first logic gate 702, respectively. Based on the first control bit CB1 and the first select bit SL1, the second logic gate 704 may be further configured to output a second select bit SL2. In an embodiment, the second logic gate 704 is an OR gate. Thus, the second logic gate 704 outputs the second select bit SL2 having the second logic state (e.g., having a logic low state) when the first control bit CB1 and the first select bit SL1 have the second logic state. Further, the second logic gate 704 outputs the second select bit SL2 having the first logic state (e.g., having a logic high state) when at least one of the first control bit CB1 and the first select bit SL1 has the second logic state. The second select bit SL2 is thus derived from the first mask bit MB1. The second logic gate 704 may be further coupled to the first multiplexer 706, and configured to provide the second select bit SL2 to the first multiplexer 706.

The first multiplexer 706 may be coupled to the processor 102, the first storage element 208a, and the second logic gate 704. The first multiplexer 706 may be configured to receive the first write bit WB1, the first register bit RB1, and the second select bit SL2 from the processor 102, the first storage element 208a, and the second logic gate 704, respectively. Further, the first multiplexer 706 may be configured to select and output, based on the second select bit SL2, the first write bit WB1 or the first register bit RB1 as the first output bit OB1. The first multiplexer 706 selects and outputs the first register bit RB1 and the first write bit WB1 as the first output bit OB1 when the second select bit SL2 has the second and first logic states, respectively. The first multiplexer 706 may be further configured to write the first output bit OB1 to the first storage element 208a.

When the write address WA matches the first reference address RA1, the first control bit CB1 has the first logic state (e.g., has a logic high state) and the second control bit CB2 has the second logic state (e.g., has a logic low state). Thus, the first write bit WB1 is outputted as the first output bit OB1 and written to the first storage element 208a. When the write address WA matches the second reference address RA2, the first control bit CB1 has the second logic state (e.g., has a logic low state) and the second control bit CB2 has the first logic state (e.g., has a logic high state). In such a scenario, if the first mask bit MB1 has the first logic state (e.g., has a logic high state), the first write bit WB1 is outputted as the first output bit OB1 and written to the first storage element 208a. Conversely, if the first mask bit MB1 has the second logic state (e.g., has a logic low state), the first register bit RB1 is outputted as the first output bit OB1 and written to the first storage element 208a. Further, when the write address WA matches the third reference address RA3, the first and second control bits CB1 and CB2 have the second logic state (e.g., have a logic low state). Thus, the first register bit RB1 is outputted as the first output bit OB1 and written to the first storage element 208a.

The scope of the present disclosure is not limited to the implementation of the first logic circuit 206a as illustrated in FIG. 7. In various other embodiments, the first logic circuit 206a may be implemented in a different manner, without deviating from the scope of the present disclosure.

Figure 8:
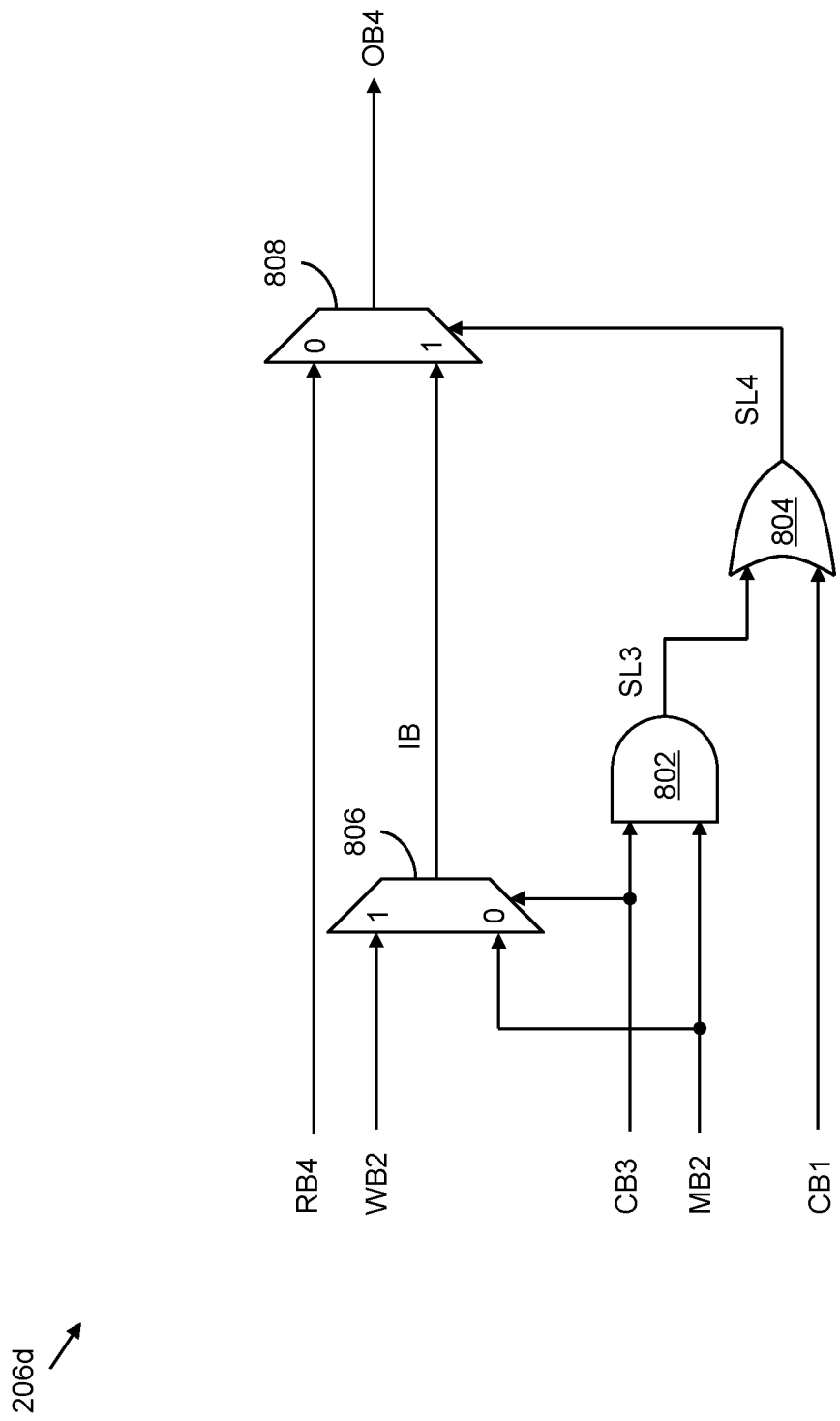
FIG. 8 illustrates a schematic circuit diagram of a logic circuit of a second set of logic circuits of the register management system of FIG. 2 in accordance with an embodiment of the present disclosure.

FIG. 8 illustrates a schematic circuit diagram of the fourth logic circuit 206d in accordance with an embodiment of the present disclosure. The fourth logic circuit 206d may include a third logic gate 802, a fourth logic gate 804, a second multiplexer 806, and a third multiplexer 808. The third logic circuit 206c is structurally similar to the fourth logic circuit 206d.

The third logic gate 802 may be coupled to the processor 102 and the address decoder 202. The third logic gate 802 may be configured to receive the second mask bit MB2 and the third control bit CB3 from the processor 102 and the address decoder 202, respectively. Based on the second mask bit MB2 and the third control bit CB3, the third logic gate 802 may be further configured to output a third select bit SL3. In an embodiment, the third logic gate 802 is an AND gate. Thus, the third logic gate 802 outputs the third select bit SL3 having the first logic state (e.g., having a logic high state) when the second mask bit MB2 and the third control bit CB3 have the first logic state. Further, the third logic gate 802 outputs the third select bit SL3 having the second logic state (e.g., having a logic low state) when at least one of the second mask bit MB2 and the third control bit CB3 has the second logic state.

The fourth logic gate 804 may be coupled to the address decoder 202 and the third logic gate 802. The fourth logic gate 804 may be configured to receive the first control bit CB1 and the third select bit SL3 from the address decoder 202 and the third logic gate 802, respectively. Based on the first control bit CB1 and the third select bit SL3, the fourth logic gate 804 may be further configured to output a fourth select bit SL4. In an embodiment, the fourth logic gate 804 is an OR gate. Thus, the fourth logic gate 804 outputs the fourth select bit SL4 having the second logic state (e.g., having a logic low state) when the first control bit CB1 and the third select bit SL3 have the second logic state. Further, the fourth logic gate 804 outputs the fourth select bit SL4 having the first logic state (e.g., having a logic high state) when at least one of the first control bit CB1 and the third select bit SL3 has the first logic state. The fourth select bit SL4 is thus derived from the second mask bit MB2. The fourth logic gate 804 may be further coupled to the third multiplexer 808, and configured to provide the fourth select bit SL4 to the third multiplexer 808.

The second multiplexer 806 may be coupled to the processor 102 and the address decoder 202. The second multiplexer 806 may be configured to receive the second write bit WB2 and the second mask bit MB2 from the processor 102, and the third control bit CB3 from the address decoder 202. Further, the second multiplexer 806 may be configured to select and output, based on the third control bit CB3, the second write bit WB2 or the second mask bit MB2 as an intermediate bit IB. The second multiplexer 806 selects and outputs the second mask bit MB2 and the second write bit WB2 as the intermediate bit IB when the third control bit CB3 has the second and first logic states, respectively.

The third multiplexer 808 may be coupled to the second multiplexer 806, the fourth storage element 208d, and the fourth logic gate 804. The third multiplexer 808 may be configured to receive the intermediate bit IB, the fourth register bit RB4, and the fourth select bit SL4 from the second multiplexer 806, the fourth storage element 208d, and the fourth logic gate 804, respectively. Based on the fourth select bit SL4, the third multiplexer 808 may be further configured to select and output the fourth register bit RB4 or the intermediate bit IB as the fourth output bit OB4. The third multiplexer 808 selects and outputs the fourth register bit RB4 and the intermediate bit IB as the fourth output bit OB4 when the fourth select bit SL4 has the second and first logic states, respectively. The third multiplexer 808 may be further configured to write the fourth output bit OB4 to the fourth storage element 208d.

When the write address WA matches the first reference address RA1, the first control bit CB1 has the first logic state (e.g., has a logic high state) and the third control bit CB3 has the second logic state (e.g., has a logic low state). Thus, the second mask bit MB2 is outputted as the fourth output bit OB4 and written to the fourth storage element 208d. When the write address WA matches the second reference address RA2, the first and third control bits CB1 and CB3 have the second logic state (e.g., have a logic low state). Thus, the fourth register bit RB4 is outputted as the fourth output bit OB4 and written to the fourth storage element 208d. Further, when the write address WA matches the third reference address RA3, the first control bit CB1 has the second logic state (e.g., has a logic low state) and the third control bit CB3 has the first logic state (e.g., has a logic high state). In such a scenario, if the second mask bit MB2 has the first logic state (e.g., has a logic high state), the second write bit WB2 is outputted as the fourth output bit OB4 and written to the fourth storage element 208d. Conversely, if the second mask bit MB2 has the second logic state (e.g., has a logic low state), the fourth register bit RB4 is outputted as the fourth output bit OB4 and written to the fourth storage element 208d.

The scope of the present disclosure is not limited to the implementation of the fourth logic circuit 206d as illustrated in FIG. 8. In various other embodiments, the fourth logic circuit 206d may be implemented in a different manner, without deviating from the scope of the present disclosure.

Figure 9:
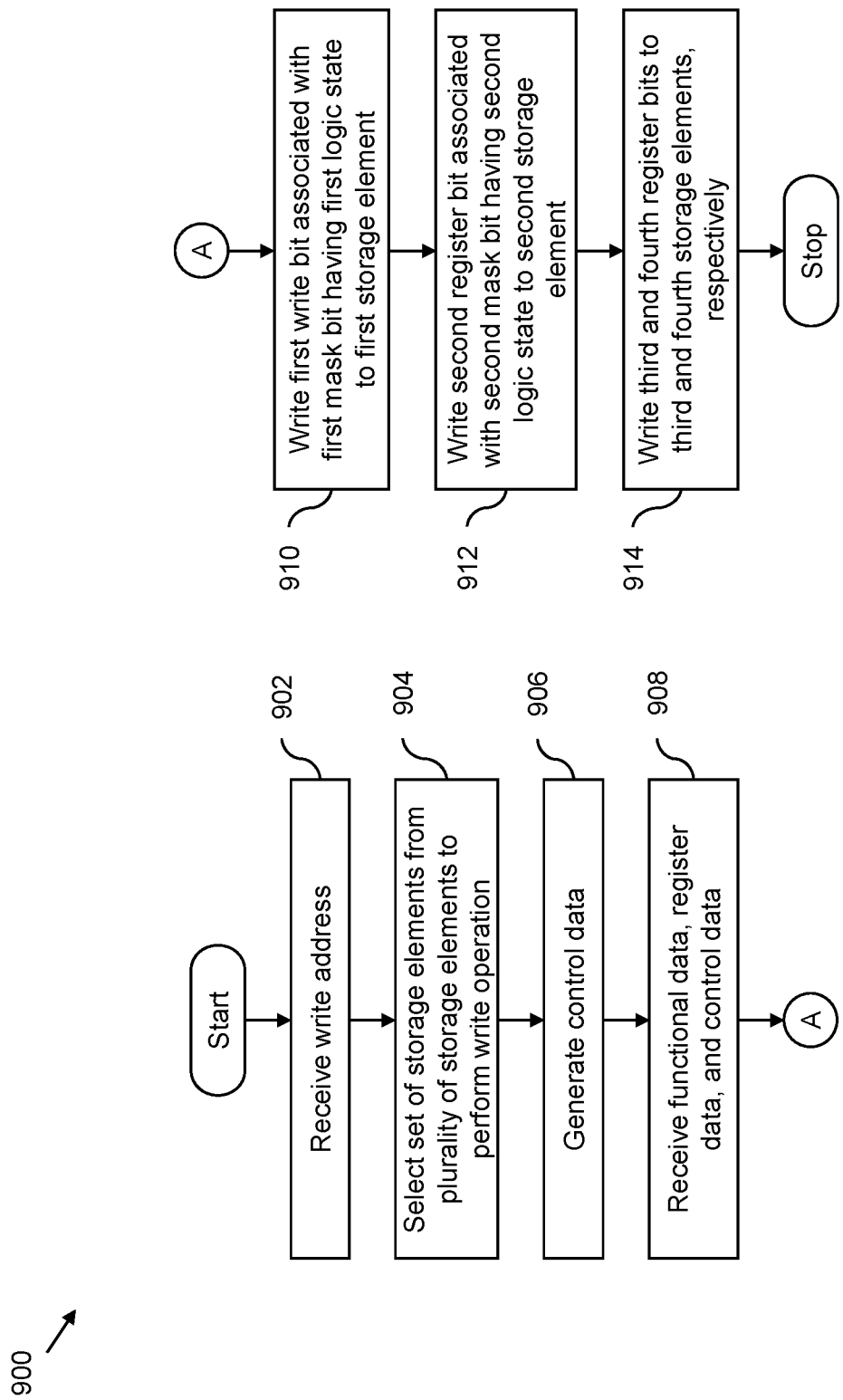
FIG. 9 represents a flowchart that illustrates a register management method in accordance with an embodiment of the present disclosure.

FIG. 9 represents a flowchart 900 that illustrates a register management method in accordance with an embodiment of the present disclosure. The register management method may correspond to performing the write operation on the register 104. The write operation may be performed on the entire register 104, the first half of the register 104, and the second half of the register 104. The processor 102 may initiate the write operation and output the write address WA and the functional data FD for the write operation. The processor 102 may output the write address WA based on a configuration map (not shown) including various reference addresses of the plurality of registers. The configuration map may include reference addresses for writing to the plurality of registers in entirety (e.g., the first reference address) grouped together followed by two separate groupings of reference addresses for writing to lower and upper halves of the plurality of registers. Alternatively, the configuration map may include the first through third reference addresses RA1-RA3 grouped together followed by each such grouping for other registers. Further, the processor 102 may output the functional data FD such that the functional data FD includes the first and second write bits WB1 and WB2 and the first and second mask bits MB1 and MB2 associated with the first and second write bits WB1 and WB2, respectively.

At step 902, the address decoder 202 may receive the write address WA for the write operation from the processor 102. At step 904, the address decoder 202 may select, based on the write address WA, the set of storage elements from the plurality of storage elements 208 to perform the write operation. In an example, the selected set of storage elements corresponds to the first half of the register 104. At step 906, the address decoder 202 may generate the control data CB1-CB3 indicating that the write operation is to be performed on the first half of the register 104. At step 908, the controller 204 may receive the functional data FD, the control data CB1-CB3, and the register data RG from the processor 102, the address decoder 202, and the register 104, respectively. In an example, the first mask bit MB1 has the first logic state (e.g., has a logic high state) and the second mask bit MB2 has the second logic state (e.g., has a logic low state).

At step 910, the controller 204 may write the first write bit WB1 associated with the first mask bit MB1 having the first logic state to the first storage element 208a. At step 912, the controller 204 may write the second register bit RB2 associated with the second mask bit MB2 having the second logic state to the second storage element 208b. As the write operation is for the first half of the register 104, the second half of the register 104 is refreshed (e.g., does not change). At step 914, the controller 204 may write the third and fourth register bits RB3 and RB4 to the third and fourth storage elements 208c and 208d, respectively. The output data OUT is thus written to the register 104.

Although it is described that the first mask bit MB1 has the first logic state (e.g., has a logic high state) and the second mask bit MB2 has the second logic state (e.g., has a logic low state), the scope of the present disclosure is not limited to it. In various other embodiments, both the first and second mask bits MB1 and MB2 may have the first logic state. In such a scenario, at step 910, the controller 204 may write the first and second write bits WB1 and WB2 associated with the first and second mask bits MB1 and MB2 to the first and second storage elements 208a and 208b, respectively, and step 912 may be omitted. Similarly, both the first and second mask bits MB1 and MB2 may have the second logic state. In such a scenario, at step 912, the controller 204 may write the first and second register bits RB1 and RB2 associated with the first and second mask bits MB1 and MB2 to the first and second storage elements 208a and 208b, respectively, and step 910 may be omitted.

When the selected set of storage elements corresponds to the second half of the register 104, the write operation is performed in a similar manner as described above. In such a scenario, the operations performed by the first set of logic circuits 206a and 206b and the second set of logic circuits 206c and 206d are swapped. The flowchart 900 illustrates the register management method for a scenario when the write address WA matches the second reference address RA2. When the write address WA matches the first reference address RA1, the functional data FD is outputted as the output data OUT and written to the register 104.

The register management system 106 thus enables bit-wise write operations with the register 104. Conventionally, when a processor is required to write to a portion of a register, the processor has to access the register in entirety. For example, the processor reads the entire data stored in the register, modifies one or more bits of the data, and writes the modified data back to the register. This is referred to as a read-modify-write operation. Such a read-modify-write operation results in the processor taking up a significant amount of clock cycles, thereby degrading the availability of the processor. In the present disclosure, the register management system 106 enables the bit-wise write operations with the register 104. Thus, a need to perform read-modify-write operations is eliminated. As a result, a number of clock cycles required by the processor 102 to perform the write operation significantly decreases. Consequently, the availability of the processor 102 significantly increases.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:
a register that comprises a plurality of storage elements; and
a register management system that is coupled to the register, and configured to:
receive a write address and functional data for a write operation to be performed on the register, wherein the functional data comprises (i) a set of write bits and (ii) a set of mask bits associated with the set of write bits, respectively, wherein the set of mask bits comprises one or more mask bits having a first logic state, wherein a number of write bits and a number of mask bits are each half of a number of bits in the register, and wherein the one or more mask bits having the first logic state indicate that associated one or more write bits of the set of write bits are to be written to the register, respectively;
select, from the plurality of storage elements based on the write address, a set of storage elements to perform the write operation, wherein the selected set of storage elements corresponds to one of a group consisting of a first half of bits in the register and a second half of bits in the register; and
write the one or more write bits associated with the one or more mask bits having the first logic state to one or more storage elements of the selected set of storage elements, respectively.

2. The IC of claim 1, wherein the register management system is further configured to receive a set of register bits stored in the selected set of storage elements, respectively, wherein the set of mask bits is further associated with the set of register bits, respectively, and further comprises one or more mask bits having a second logic state that is different than the first logic state, wherein the one or more mask bits having the second logic state indicate that associated one or more register bits of the set of register bits are to be written back to the register, respectively, and wherein the register management system is further configured to write the one or more register bits to remaining storage elements of the selected set of storage elements.

3. The IC of claim 2, wherein the plurality of storage elements is configured to store a plurality of register bits, respectively, wherein the plurality of register bits comprises the set of register bits, and wherein the first half of the register stores a least significant bit of the plurality of register bits and the second half of the register stores a most significant bit of the plurality of register bits.

4. The IC of claim 2, wherein the register management system comprises:
an address decoder configured to (i) receive the write address, (ii) select, based on the write address, the set of storage elements from the plurality of storage elements to perform the write operation, and (iii) generate control data indicative of the selected set of storage elements; and
a controller that is coupled to the address decoder and the register, and configured to receive the functional data, the control data, and the set of register bits, wherein, based on the control data, the controller is further configured to (i) write the one or more write bits associated with the one or more mask bits having the first logic state to the one or more storage elements of the set of storage elements, respectively, and (ii) write the one or more register bits associated with the one or more mask bits having the second logic state, respectively, to the remaining storage elements of the selected set of storage elements.

5. The IC of claim 4, wherein the control data comprises a first control bit, a second control bit, and a third control bit, and wherein the second control bit having the first logic state and the first control bit and the third control bit having the second logic state indicate that the selected set of storage elements corresponds to the first half of the register.

6. The IC of claim 4, wherein the control data comprises a first control bit, a second control bit, and a third control bit, and wherein the third control bit having the first logic state and the first control bit and the second control bit having the second logic state indicate that the selected set of storage elements corresponds to the second half of the register.

7. The IC of claim 4, wherein the control data comprises a first control bit, a second control bit, and a third control bit, wherein the address decoder generates the first control bit, the second control bit, and the third control bit based on comparison of the write address with a first reference address, a second reference address, and a third reference address, respectively, and wherein the first reference address corresponds to an address for writing to the register in entirety, the second reference address corresponds to an address for writing to the first half of the register, and the third reference address corresponds to an address for writing to the second half of the register.

8. The IC of claim 7, wherein the first control bit has the first logic state and the second control bit and the third control bit have the second logic state when the write address matches the first reference address, wherein the second control bit has the first logic state and the first control bit and the third control bit have the second logic state when the write address matches the second reference address, and wherein the third control bit has the first logic state and the first control bit and the second control bit have the second logic state when the write address matches the third reference address.

9. The IC of claim 7, wherein the controller comprises a first set of logic circuits that is coupled to the first half of the register and the address decoder, and configured to:
receive the functional data, the first control bit, the second control bit, and the set of register bits, wherein the second control bit has the first logic state and the first control bit has the second logic state to indicate that the selected set of storage elements corresponds to the first half of the register; and
write, based on the first and second control bits, the one or more write bits associated with the one or more mask bits having the first logic state, respectively, and the one or more register bits associated with the one or more mask bits having the second logic state, respectively, to the first half of the register.

10. The IC of claim 9, wherein a logic circuit of the first set of logic circuits comprises a first multiplexer that is coupled to a first storage element of the first half of the register, and configured to:
receive a first write bit of the set of write bits, a first register bit of the set of register bits that is stored in the first storage element, and a first select bit that is derived from a first mask bit of the set of mask bits;
select and output, based on the first select bit, one of a group consisting of the first write bit and the first register bit as a first output bit; and
write the first output bit to the first storage element, wherein when the first mask bit has the first logic state, the first write bit is written to the first storage element, and when the first mask bit has the second logic state, the first register bit is written to the first storage element.

11. The IC of claim 10, wherein the logic circuit of the first set of logic circuits further comprises:
a first logic gate that is coupled to the address decoder, and configured to receive the second control bit and the first mask bit, and output a second select bit based on the second control bit and the first mask bit, wherein the second select bit has the first logic state when the first mask bit and the second control bit have the first logic state, and the second select bit has the second logic state when at least one of a group consisting of the first mask bit and the second control bit has the second logic state; and
a second logic gate that is coupled to the address decoder, the first logic gate, and the first multiplexer, and configured to (i) receive the first control bit and the second select bit, (ii) output the first select bit based on the first control bit and the second select bit, and (iii) provide the first select bit to the first multiplexer, wherein the first select bit has the second logic state when the first control bit and the second select bit have the second logic state, and the first select bit has the first logic state when at least one of a group consisting of the first control bit and the second select bit has the first logic state.

12. The IC of claim 7, wherein the controller comprises a second set of logic circuits that is coupled to the second half of the register and the address decoder, and configured to:
receive the functional data, the first control bit, the third control bit, and the set of register bits, wherein the third control bit has the first logic state and the first control bit has the second logic state to indicate that the selected set of storage elements corresponds to the second half of the register; and
write, based on the first and third control bits, the one or more write bits associated with the one or more mask bits having the first logic state, respectively, and the one or more register bits associated with the one or more mask bits having the second logic state, respectively, to the second half of the register.

13. The IC of claim 12, wherein a logic circuit of the second set of logic circuits comprises:
a second multiplexer that is coupled to the address decoder, and configured to receive a second write bit of the set of write bits, a second mask bit of the set of mask bits, and the third control bit, and select and output, based on the third control bit, one of a group consisting of the second write bit and the second mask bit as an intermediate bit; and
a third multiplexer that is coupled to the second multiplexer and a second storage element of the second half of the register, and configured to (i) receive the intermediate bit, a second register bit of the set of register bits that is stored in the second storage element, and a third select bit that is derived from the second mask bit, (ii) select and output, based on the third select bit, one of a group consisting of the second register bit and the intermediate bit as a second output bit, and (iii) write the second output bit to the second storage element, wherein when the second mask bit has the first logic state, the second write bit is written to the second storage element, and when the second mask bit has the second logic state, the second register bit is written to the second storage element.

14. The IC of claim 13, wherein the logic circuit of the second set of logic circuits further comprises:
a third logic gate that is coupled to the address decoder, and configured to receive the third control bit and the second mask bit, and output a fourth select bit based on the third control bit and the second mask bit, wherein the fourth select bit has the first logic state when the second mask bit and the third control bit have the first logic state, and the fourth select bit has the second logic state when at least one of a group consisting of the second mask bit and the third control bit has the second logic state; and
a fourth logic gate that is coupled to the address decoder, the third logic gate, and the third multiplexer, and configured to (i) receive the first control bit and the fourth select bit, (ii) output the third select bit based on the first control bit and the fourth select bit, and (iii) provide the third select bit to the third multiplexer, wherein the third select bit has the second logic state when the first control bit and the fourth select bit have the second logic state, and the third select bit has the first logic state when at least one of a group consisting of the first control bit and the fourth select bit has the first logic state.

15. The IC of claim 1, further comprising a processor that is configured to initiate the write operation with the register, and output the write address and the functional data.

16. The IC of claim 1, wherein the one or more write bits associated with the one or more mask bits having the first logic state, respectively, comprises at least one of a group consisting of a write bit having a logic low state and a write bit having a logic high state.

17. A register management method, comprising:
receiving, by a register management system, a write address and functional data for a write operation to be performed on a register, wherein the functional data comprises (i) a set of write bits and (ii) a set of mask bits associated with the set of write bits, respectively, wherein the set of mask bits comprises one or more mask bits having a first logic state, wherein a number of write bits and a number of mask bits are each half a number of bits in the register, and wherein the one or more mask bits having the first logic state indicate that associated one or more write bits of the set of write bits are to be written to the register, respectively;
selecting, by the register management system, based on the write address, a set of storage elements of the register to perform the write operation, wherein the set of storage elements corresponds to one of a group consisting of a first half of bits in the register and a second half of bits in the register; and
writing, by the register management system, the one or more write bits associated with the one or more mask bits having the first logic state to one or more storage elements of the set of storage elements, respectively.

18. The register management method of claim 17, further comprising:
receiving, by the register management system, a set of register bits stored in the selected set of storage elements, wherein the set of mask bits is further associated with the set of register bits, respectively, and further comprises one or more mask bits having a second logic state, wherein the one or more mask bits having the second logic state indicate that associated one or more register bits of the set of register bits are to be written back to the register, respectively, and wherein the second logic state is different than the first logic state; and writing, by the register management system, the one or more register bits to remaining storage elements of the selected set of storage elements.

19. The register management method of claim 18, wherein a plurality of register bits is stored in the register, wherein the plurality of register bits comprises the set of register bits, and wherein the first half of the register stores a least significant bit of the plurality of register bits and the second half of the register stores a most significant bit of the plurality of register bits.

20. The register management method of claim 17, wherein the one or more write bits associated with the one or more mask bits having the first logic state, respectively, comprises at least one of a group consisting of a write bit having a logic low state and a write bit having a logic high state.

* * * * *